US011188117B2

(12) United States Patent
Mosalikanti et al.

(10) Patent No.: US 11,188,117 B2
(45) Date of Patent: Nov. 30, 2021

(54) LOW LATENCY ANALOG ADAPTIVE CLOCKING

(71) Applicant: Intel Corporation, Santa Clara, CA (US)

(72) Inventors: Praveen Mosalikanti, Portland, OR (US); Nasser Kurd, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/637,646

(22) PCT Filed: Sep. 6, 2018

(86) PCT No.: PCT/US2018/049790
§ 371 (c)(1),
(2) Date: Feb. 7, 2020

(87) PCT Pub. No.: WO2019/060143
PCT Pub. Date: Mar. 28, 2019

(65) Prior Publication Data
US 2020/0272197 A1    Aug. 27, 2020

Related U.S. Application Data

(60) Provisional application No. 62/562,335, filed on Sep. 22, 2017.

(51) Int. Cl.
*G06F 1/10* (2006.01)
*H03L 7/093* (2006.01)
*H03L 7/099* (2006.01)

(52) U.S. Cl.
CPC ............ *G06F 1/10* (2013.01); *H03L 7/093* (2013.01); *H03L 7/099* (2013.01); *H03L 2207/06* (2013.01); *H03L 2207/50* (2013.01)

(58) Field of Classification Search
CPC ....... H03L 7/07; H03L 7/0805; H03L 7/0812; H03L 7/0995; H03L 7/099;
(Continued)

(56) References Cited

U.S. PATENT DOCUMENTS

| 2005/0218955 A1 | 10/2005 | Kurd et al. |
| 2006/0141963 A1 | 6/2006 | Maxim et al. |

(Continued)

FOREIGN PATENT DOCUMENTS

WO    2017151198    9/2017

OTHER PUBLICATIONS

International Search Report & Written Opinion dated Jan. 4, 2019 for PCT Patent Application No. PCT/US2018/049790.
(Continued)

*Primary Examiner* — John W Poos
(74) *Attorney, Agent, or Firm* — Schwabe, Williamson & Wyatt, P.C.

(57) ABSTRACT

An apparatus is provided for low latency adaptive clocking, the apparatus comprises: a first power supply rail to provide a first power; a second power supply rail to provide a second power; a third power supply rail to provide a third power; a voltage divider coupled to the first, second, and third power supply rails; a bias generator coupled to voltage divider and the third power supply rail; an oscillator coupled to the bias generator and the first supply rail; and a clock distribution network to provide an output of the oscillator to one or more logics, wherein the clock distribution network is coupled to the second power supply rail.

22 Claims, 5 Drawing Sheets

(58) Field of Classification Search
CPC ... H03L 2207/06; H03L 7/093; H03L 7/0891; H03L 7/087; H03L 7/0991; H03L 7/18; H03L 7/085; H03L 2207/50; H03K 3/0315; H03K 3/0322; H03K 3/012; G06F 1/3296; G06F 1/26; G06F 1/32; G06F 1/28; G06F 1/10

See application file for complete search history.

(56) References Cited

U.S. PATENT DOCUMENTS

| | | | |
|---|---|---|---|
| 2009/0256601 A1* | 10/2009 | Zhang | H03L 7/089 |
| | | | 327/156 |
| 2013/0257546 A1 | 10/2013 | Xue | |
| 2013/0307631 A1* | 11/2013 | Lotfy | H03L 7/0992 |
| | | | 331/34 |
| 2016/0204787 A1 | 7/2016 | Lotfy et al. | |

OTHER PUBLICATIONS

International Preliminary Report on Patentability dated Apr. 2, 2020 for PCT Patent Application No. PCT/US2018/049790.

* cited by examiner

LOW LATENCY ANALOG ADAPTIVE CLOCKING

CLAIM OF PRIORITY

This Application is a National Stage Entry of, and claims priority to, PCT Patent Application No. PCT/US2018/049790, filed Sep. 6, 2018, and titled "LOW LATENCY ADAPTIVE CLOCKING," which claims the benefit of Provisional Patent Application No. 62/562,335, filed Sep. 22, 2017, and titled "LOW LATENCY ADAPTIVE CLOCKING," both of which are incorporated by reference in entirety for all purposes.

BACKGROUND

Clock signal may be generated by a phase locked loop (PLL). A clock signal may be distributed throughout a processor to facilitate the processor's operation. For example, state elements (e.g., flip-flops, latches, etc.) located at different points in the processor die may function synchronously by operating in accordance with the clock signal. When a large, sudden current requirement occurs, the on-die voltage supply provided to the state elements may "droop" (e.g., for a few nanoseconds) while the PLL continues to generate a clock signal with a fixed frequency. Note that other voltage droop events may last even longer. To ensure that the processor functions during these droop events, a high voltage margin may be provided for the state elements even during normal operation (e.g., when there is no voltage droop). That is, the processor is designed to operate at both the highest specified frequency and at the lowest potential voltage simultaneously.

Since power has a quadratic dependence on voltage, a significant amount of power may be wasted during normal operation to ensure functionality during the infrequent voltage droops. Moreover, as processor speed and integration increases, the amount of power that is required may become a limiting factor. For example, the costs of designing and cooling a processor that consumes a significant amount of power may become impractical.

Existing analog PLLs implement Adaptive Frequency Scaling (AFS) to compensate for power supply voltage droops and overshoots. One such AFS technique is described by U.S. Pat. No. 6,922,111. Current analog implementation of AFS technique directly modulates the VCO supply through resistive coupling of the digital power supply. The current analog implementation does not fully exploit the full benefits of the AFS technique at lower voltages and lower frequencies.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
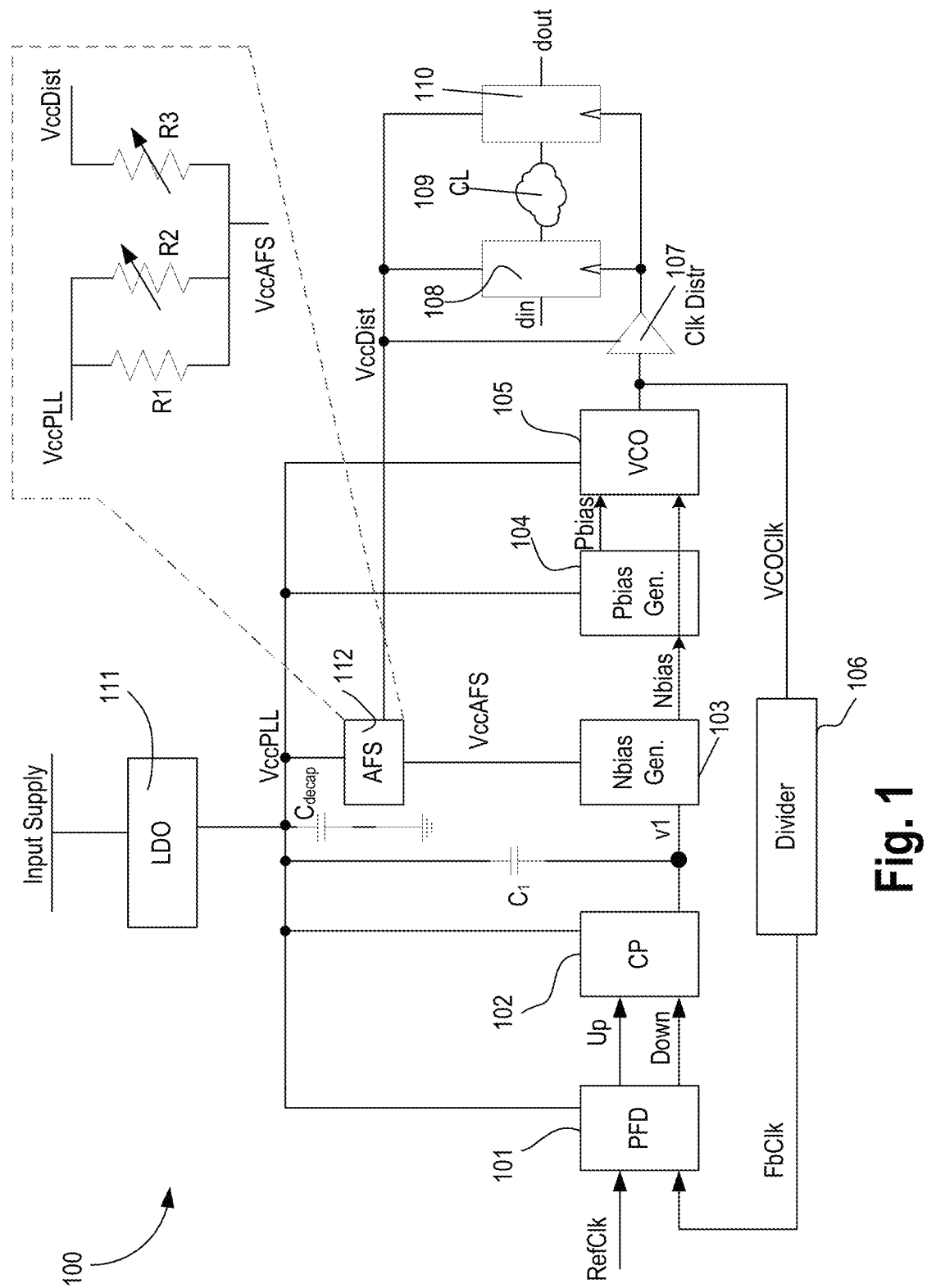
FIG. 1 illustrates an analog phase locked loop (PLL) with adaptive frequency scaling (AFS) applied to a bias generator, according to some embodiments of the disclosure.

Various embodiments enable Adaptive Frequency Scaling (AFS) down to lower distribution supply voltages with nearly instantaneous response times versus other techniques that trade off response time for the range of supported supply levels. Significant performance is left on the table due to supply droops that cause clock and data to slow down by different amounts. AFS (Adaptive Frequency System) addresses this by slowing down the PLL in response to any droops sensed on the noisy supply rail used by the clock distribution and the data-path, VccDist.

One AFS implementation in analog PLLs uses a potentiometer between the noisy distribution supply, VccDist and the regulated PLL supply, VccPLL to inject some of the noise on VccDist onto the voltage control oscillator's (VCO's) supply to effect a frequency change. This offers very fast response times but due to the VCO's headroom requirements, the range of VccDist over which AFS can be employed is limited to a threshold voltage (e.g., about 0.85 V).

There are many technical effects of the various embodiments. For example, the low latency adaptive clocking apparatus of various embodiments applies an AFS for clock-data compensation to minimize (or reduce) frequency guard-band. The potentiometer (of AFS) is used to sense noise on VccDist and inject it on a bias. The noise on the bias modulates the output frequency of the VCO clock (output of the VCO). As such, a traditional droop detector and associated circuits are not used, resulting in lower latency adaptive clocking environment. Other technical effects will be evident from the various figures and embodiments.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

It is pointed out that those elements of the figures having the same reference numbers (or names) as the elements of any other figure can operate or function in any manner similar to that described, but are not limited to such.

FIG. 1 illustrates an apparatus 100 comprising an analog PLL with AFS applied to a bias generator, according to some embodiments of the disclosure. An analog PLL comprises a phase frequency detector (PFD) 101, charge pump (CO) 102, low pass filter (LPF) comprising capacitor $C_1$, bias generator (e.g., Nbias Gen. 103 and Pbias Gen. 104), voltage and controlled oscillator (VCO) 105. The output VCOClk of VCO 105 is divided by a ratio by divider 106 and that divided output FbClk (feedback clock) is received by the phase detector that compares the phases and frequency of the feedback clock and a reference clock RefClk. Accordingly, the PFD 101 generates up/down signals for CP 102. The output v1 of CP 102 is filtered using capacitor C1 and provided as input to the Nbias generator (Nbias Gen.) 103. The Nbias generator 103 generates an Nbias to bias another bias generator called the Pbias generator (Pbias Gen.) 104. The Nbias Gen. 103 also generates a version of v1 called Vctrl. Nbias is used by Pbias Gen. 104 which generated Pbias using the Nbias. This Pbias is provided to the VCO 105 to control its oscillating frequency according to the output of the PFD 101. Pbias is same as the Vctrl (control voltage), which is also used to adjust the frequency of VCOClk.

In some embodiments, the apparatus 100 comprises a voltage generator 111 (e.g., a DC-DC converter, a low-dropout (LDO) regulator, or the like) which provides a power supply VccPLL for the analog PLL using input power supply (Input Supply). In some embodiments, AFS 112 comprises a voltage divider as shown with programmable and/or fixed resistances R1, R2, and R3. The output of the AFS are VccAFS and VccDist. The amount of noise percentage from VccDist which is added onto VccAFS depends on the ratio of the resistances R1, R2, and R3 of the voltage divider of the AFS.

In some embodiments, apparatus 100 comprises a clock distribution (Clk Distr.) 107 network (e.g., flip-flops and buffers/inverters) which receives the output VCOClk or its buffered version and drives that to other locations of the chip. In some embodiments, the power supply VccPLL from the power generator or source (e.g., DC-DC converter, LDO converter 111) is used to power the Pbias Gen. 104 and the VCO 105, while the Nbias Gen. 103 is powered by VccAFS, and the clock distribution (Clk Distr) 107 network is powered by VccDist. In this example, the data path comprising flip-flop 108, combinational logic (CL) 109, and flip-flop 110 are also powered by VccDist. The clock from Clk Distr. 107 is used to sample input data din and provided output data dout.

In some embodiments, supply noise is injected (using a potentiometer such as AFS 112 between VccPLL and VccDist) onto the Nbias generator's supply instead of the VCO. In some embodiments, modulation of Nbias directly affects the VCO's frequency. Since the Nbias generator 103 consumes far less current than a VCO, it has less stringent headroom requirements and can support AFS down to a lower voltage (e.g., less than 0.85V). Various embodiments here do not use a droop detector which can add latency (e.g., approximately 200-500 pico-seconds), thus offering nearly instantaneous response to supply noise.

In some embodiments, the AFS 112 helps maintain or increase the timing margin in a path by slowing down the clock in response to a voltage droop in the distribution/datapath supply (VccDist). Analyzing the total margin in a timing path for different VccDist levels provides an indication of the lowest VccDist level at which AFS can be used, for example. In some embodiments, both Nbias Gen and the Pbias Gen blocks/circuits are powered by VccAFS while the VCO is powered by VccPLL.

Here, AFS 112 is used for clock-data compensation to minimize (or reduce) frequency guard-band, in accordance with some embodiments. The potentiometer (of AFS) is used to sense noise on VccDist and inject it on Nbias. The noise on Nbias modulates the output frequency of the VCO clock (output of the VCO). In some embodiments, VCO 105 is an inductor-capacitor (LC) oscillator (LCO). In an LCO, the frequency of VCOClk is adjusted by a reference voltage and/or by switching in a variable number of smaller capacitors using coarse and/or fine codes. These coarse and/or fine codes can be generated by converting Pbias (or Vctrl) into digital codes (e.g., coarse and/or fine codes) for the varactor of the LCO.

Figure 2:
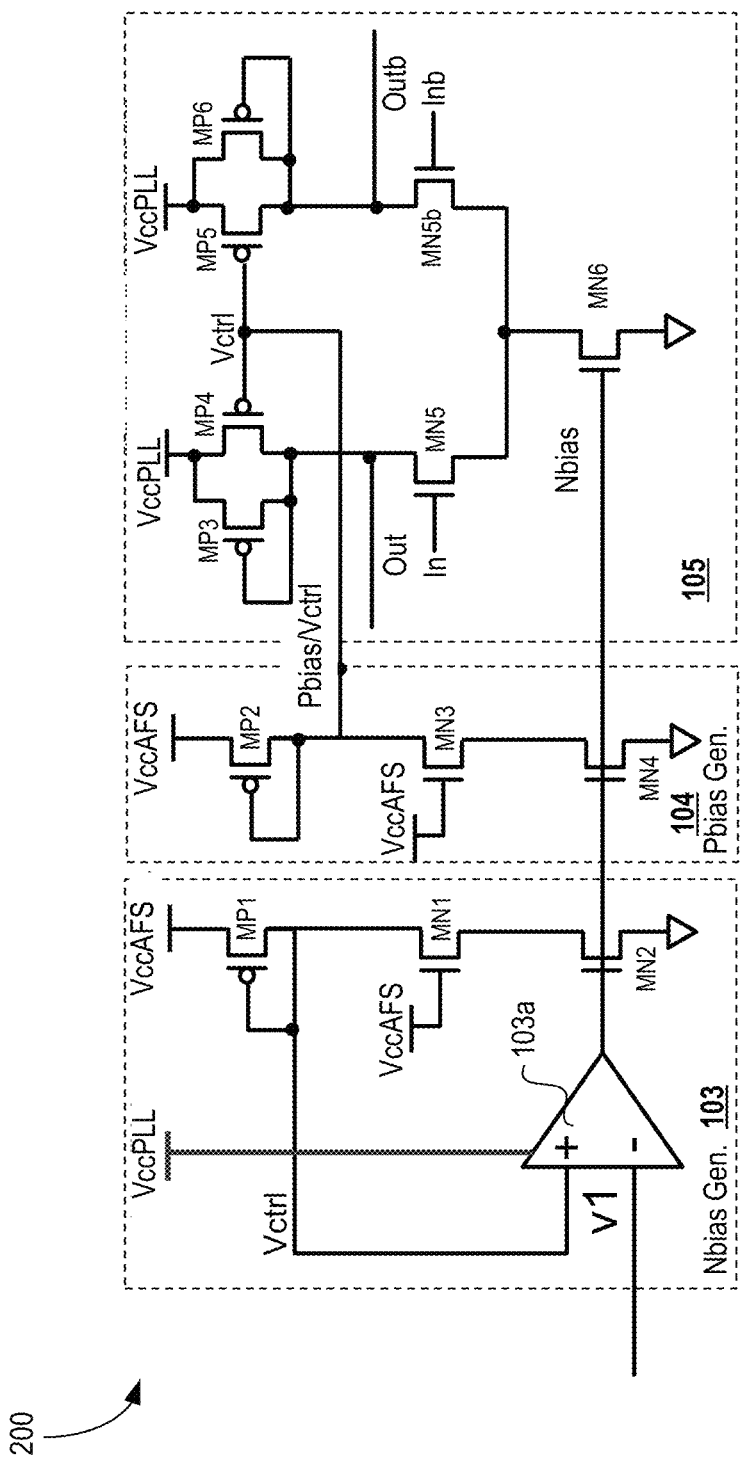
FIG. 2 illustrates an apparatus showing the bias generator and a delay state of an oscillator, where the bias generator operates on the power supply provided by the AFS, in accordance with some embodiments.

FIG. 2 illustrates apparatus 200 showing the bias generator (104 and 105) and a delay stage of VCO 105, where the bias generators 103 and 104 operate on the power supply provided by AFS 112, in accordance with some embodiments. In this example, both Nbias Gen. 103 and Pbias Gen. 104 are powered by VccAFS while VCO 105 (here one delay cell is shown) is powered by VccPLL.

Nbias Gen. 103 comprises amplifier 103a, p-type devices MP1, and n-type devices MN1 and MN2 coupled together as shown. The input V1 is received by amplifier 103a which adjusts the current strength of transistor MN2 such that the inputs Vctrl and V1 are substantially equal. Transistor MN1 is powered by VccAFS. Transistor MP1 is diode connected and provides Vctrl. In some embodiments, the entire circuitry and devices of Nbias Gen. 103 are powered by VccAFS. In some embodiments, amplifier 103a is powered by VccPLL while the other devices are powered by VccAFS. Nbias Gen. 103 provides one or two outputs—Vctrl and Nbias. The Nbias is used to bias n-type devices of subsequent circuits.

Pbias Gen. 104 comprises p-type transistor MP2 and n-type transistors MN3 and MN4 coupled together as shown. The circuit architecture of Pbias Gen. 104 is similar to the structure architecture of Nbias 103 minus the amplifier 103a and associated circuitries. Transistor MN4 is biased by Nbias, transistors MN3 is biased by VccAFS, while transistor MP2 is diode-connected and powered by VccAFS.

Here, one delay stage is illustrated for VCO 105. A person skilled in the art would appreciate that multiple delay stages are used that are coupled together in a ring formation to form an oscillator. The delay stage comprises p-type transistors MP3, MP4, MP5, and MP6, and n-type devices MN5, MN5b, and MN6 coupled together as shown. The output of the delay stage is a differential output Out and Outb. Transistor MN6 is biased by Nbias while Vctrl or Pbias is used to bias transistors MP4 and MP5. Each delay stage receives an output (e.g., differential output) from is adjacent delay stage as inputs In and Inb.

In various embodiments, the delay stages of VCO 105 are powered by VccPLL. In some embodiments, Nbias Gen. 103 is powered by VccAFS while Pbias Gen. 104 is powered by VccPLL. In some embodiments, Pbias. Gen 104 is powered by VccAFS while the Nbias Gen. 103 is powered by VccPLL. In some embodiments, the amplifier 103a of the Nbias Gen. 103 circuit is powered by VccPLL.

Figure 3:
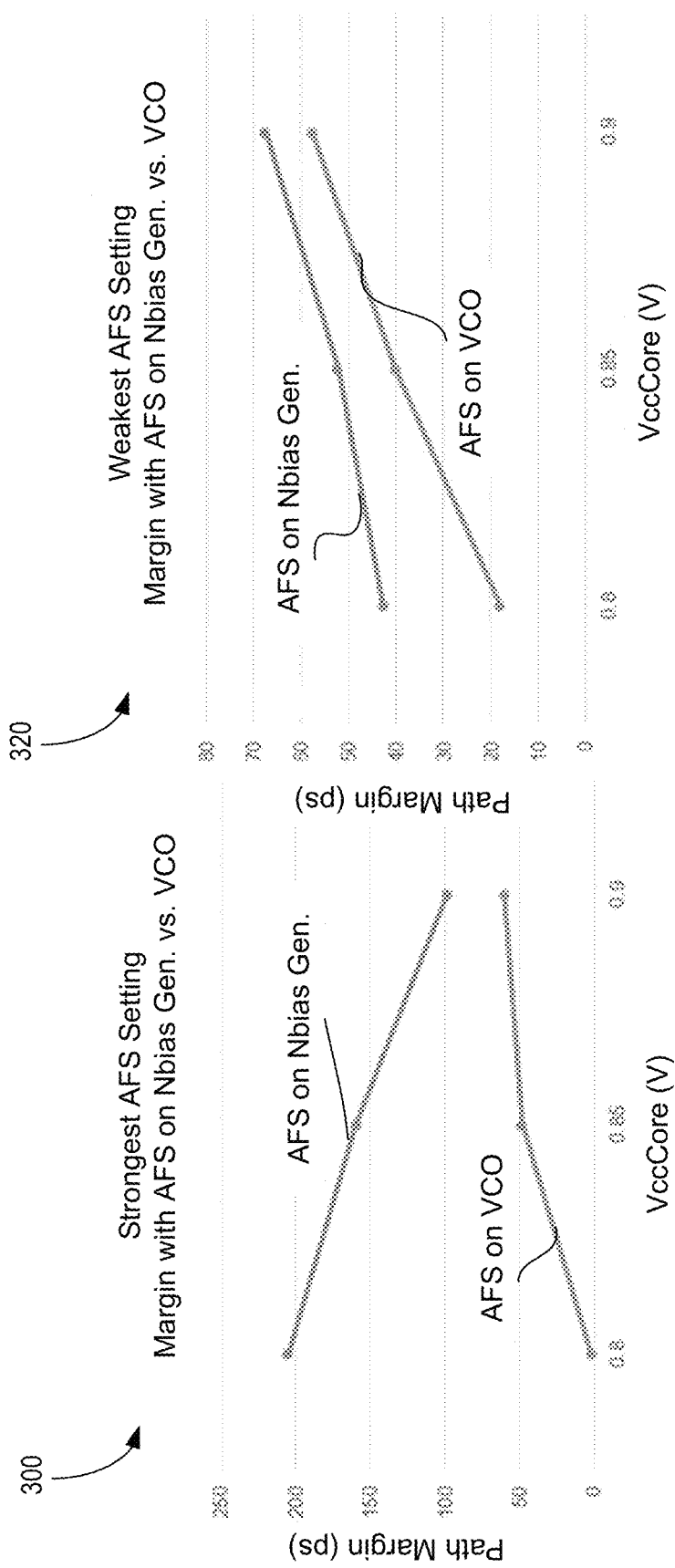
FIGS. 3A-B illustrate plots, respectively, showing timing margin improvement using the AFS for bias generators, in accordance with some embodiments.

FIGS. 3A-B illustrate plots 300 and 320, respectively, showing timing margin improvement using the AFS for bias generators, in accordance with some embodiments. The results in the plots compare the timing margin in a given path at the strongest AFS setting (e.g., setting that injects the most noise) between the AFS on VCO and AFS on Nbias Gen. schemes. The results indicate that injecting noise into the VCO's supply may not be used below 0.85V because the margin approaches 0 ps, while the proposed scheme of various embodiments can be used all the way down to 0.8 V or lower with plenty of timing margin (e.g., at the strongest AFS setting). This enables the proposed technique of various embodiments to be used at much lower voltages too.

Figure 4:
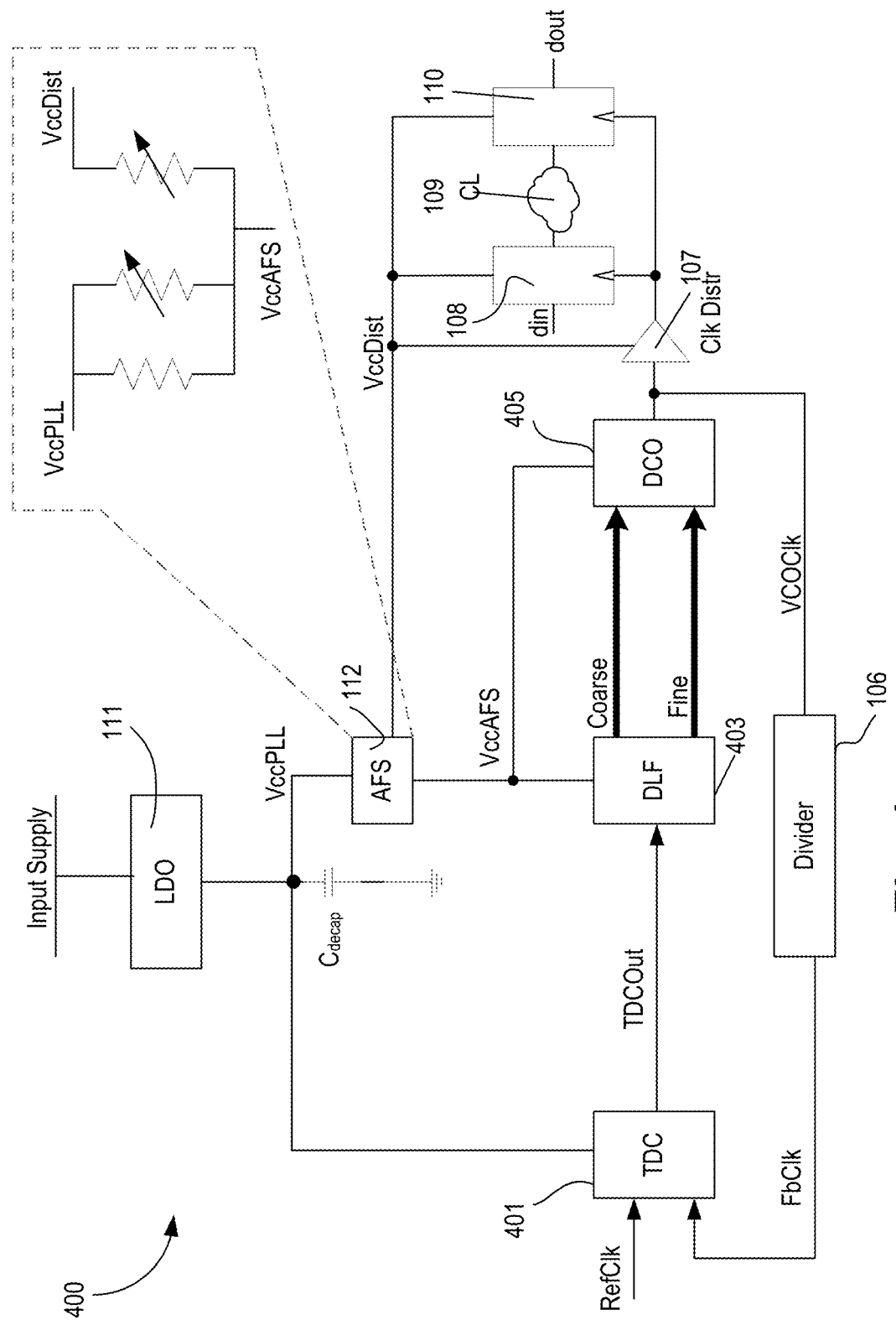
FIG. 4 illustrates a digital PLL (DPLL) with AFS applied to a digitally controlled oscillator (DCO) and/or a loop filter, according to some embodiments of the disclosure.

FIG. 4 illustrates apparatus 400 which comprises a digital PLL with AFS applied to a DCO 405 (digitally controlled oscillator) and/or a loop filter, according to some embodiments of the disclosure. A digital PLL as opposed to an analog PLL uses primarily digital circuits and signals to control the clock frequency generation and preservation.

Here, the term "analog signal" is any continuous signal for which the time varying feature (variable) of the signal is a representation of some other time varying quantity, i.e., analogous to another time varying signal. Here the term "digital signal" is a physical signal that is a representation of a sequence of discrete values (a quantified discrete-time signal), for example of an arbitrary bit stream, or of a digitized (sampled and analog-to-digital converted) analog signal.

In some embodiments, the digital PLL of apparatus 400 comprises a time-to-digital converter (TDC) 401, digital loop filter (DLF) 403, digitally controlled oscillator (DCO) 405, and other circuitries similar to those described with reference to FIG. 1. TDC 401 receives RefClk and FbClk, and provides a digital stream as output TDCOut that indicates a digital representation of the phase difference between RefClk and FbClk. TDC can comprise a delay line having multiple delay stages (e.g., buffers or inverters), and the output of each delay stage (and input of the first delay stage) is sampled by a flip-flop that uses the reference clock as the sampling clock. The input to the first delay stage in the delay line is the FbClk. As such, the FbClk is regularly sampled by RefClk. The outputs of the flip-flops are then combined to provide the digital stream TDCOut. TDCOut is then received by DLF 403 that filters any noise in TDCOut using a filter equation. The filter can be implemented using any suitable digital filter such as finite impulse response (FIR), infinite impulse response (IIR) filters. A controller (not shown as a separate circuitry but integrated in the DLF 403) generates the Coarse and Fine codes that are control codes for changing the frequency of the VCOClk from DCO 405 by large or small amounts.

The DCO 405 can be any suitable digital oscillator such as a delay line with adjustable loading (e.g., capacitive loading) at the outputs of each delay stage of the delay line. These adjustable loadings can be controlled (e.g., added to or subtracted from the loading) by the coarse and/or fine codes. In some embodiments, DCO 405 is an inductor-capacitor (LC) oscillator (LCO). In an LCO, the frequency of VCOClk is adjusted by switching in a variable number of smaller capacitors using coarse and/or fine codes.

In some embodiments, VccPLL is used to power the TDC 401 (just as PFD 101 of the analog PLL of FIG. 1 is powered by VccPLL). In some embodiments, the clock distribution is powered by VccDist. In some embodiments, the DFL 403 and the DCO 405 are powered by VccAFS. As such, the coarse and fine codes (digital signals) are adjusted according to the noise injected onto VccAFS. This noise then adjusts the frequency of the DCO in a manner that has low latency effect. In some embodiments, the noise on the DCO 405 modulates the frequency. In some embodiments, using VccAFS for providing supply to the DLF 403 and the DCO 405 removes the need for level shifters. Level shifters result in latency penalty, and that penalty is removed here. In various embodiments, AFS 112 (e.g., a voltage divider) senses noise on VccDist and injects the sensed noise on DLF 403 via VccAFS. This sensed noise is then translated on to Coarse and/or Fine codes, which are outputs of DLF 403. As such, the frequency of VCOClk is modulated by the sensed noise.

Figure 5:
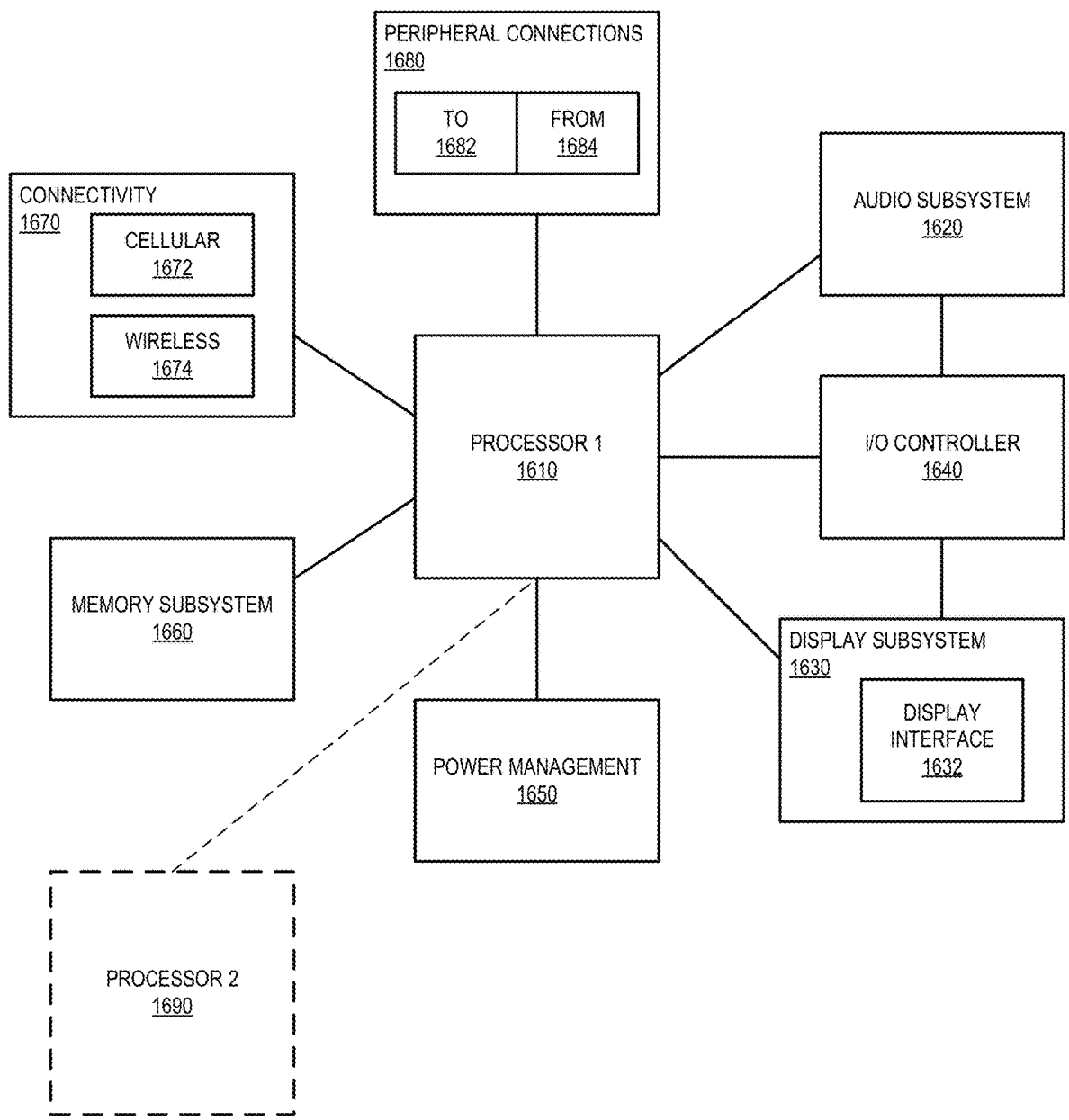
FIG. 5 illustrates a smart device or a computer system or a SoC (System-on-Chip) having the AFS for bias generators and/or for digital loop filter (DLF) and DCO, according to some embodiments of the disclosure.

FIG. 5 illustrates a smart device or a computer system or a SoC (System-on-Chip) 1600 having the apparatus for low latency adaptive clocking, according to some embodiments of the disclosure. The apparatus for low latency adaptive clocking may include the architecture of FIG. 1 for analog PLL derived clocking, or architecture of FIG. 4 for a digital PLL derived clocking. As described with reference to various embodiments, by providing filtered supplies to various components of the PLL, droop detector circuitry is removed that allows for fast response to any droop to the input supply.

FIG. 5 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes first processor 1610 having the apparatus for low latency adaptive clocking, according to some embodiments discussed. Other blocks of the computing device 1600 may also include the apparatus for low latency adaptive clocking, according to some embodiments. The various embodiments of the present disclosure may also comprise a network interface within 1670 such as a wireless interface so that a system embodiment may be incorporated into a wireless device, for example, cell phone or personal digital assistant.

In some embodiments, processor 1610 (and/or processor 1690) can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In some embodiments, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

In some embodiments, computing device 1600 comprises display subsystem 1630. Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

In some embodiments, computing device 1600 comprises I/O controller 1640. I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to, display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In some embodiments, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In some embodiments, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 1600 comprises connectivity 1670. Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

In some embodiments, computing device 1600 comprises peripheral connections 1680. Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1

An apparatus comprising: a first power supply rail to provide a first power; a second power supply rail to provide a second power; a third power supply rail to provide a third power; a voltage divider coupled to the first, second, and third power supply rails; a bias generator coupled to voltage divider and the third power supply rail; an oscillator coupled to the bias generator and the first supply rail; and a clock distribution network to provide an output of the oscillator to one or more logics, wherein the clock distribution network is coupled to the second power supply rail.

Example 2

The apparatus of example 1, wherein the bias generator comprises an amplifier which is coupled to the second power supply rail.

Example 3

The apparatus of example 1 comprises a voltage regulator coupled to the first power supply rail, wherein the voltage regulator is to provide the first power to the first power supply rail.

Example 4

The apparatus of example 3, wherein the voltage regulator comprises a low dropout circuitry.

Example 5

The apparatus of example 1, wherein the oscillator is a voltage controlled oscillator.

Example 6

The apparatus of example 1 comprises a phase frequency detector coupled to the first power supply rail, wherein the phase frequency detector is to receive a reference clock and a feedback clock as inputs, and is to generate one or more outputs indicating a phase difference between the reference clock and the feedback clock.

Example 7

The apparatus of example 6 comprises a divider coupled to the oscillator and phase frequency detector, wherein the divider is to divide an output of the oscillator and provide the feedback clock, and wherein the divider is coupled by the first power supply rail.

Example 8

The apparatus of example 1, wherein the voltage divider includes one or more programmable resistive devices.

Example 9

The apparatus of example 8, wherein the voltage divider is to sense noise on the second power supply rail and is to inject the sensed noise on the bias generator such that an output of the bias generator modulates a frequency of the oscillator according to the injected sensed noise.

Example 10

An apparatus comprising: a first power supply rail to provide a first power; a second power supply rail to provide a second power; a third power supply rail to provide a third power; a voltage divider coupled to the first, second, and third power supply rails; a digital loop filter coupled to the voltage divider and the third power supply rail; an oscillator coupled to the digital loop filter and the third power supply rail; a clock distribution network to provide an output of the oscillator to one or more logics, wherein the clock distribution network is coupled to the second power supply rail; and a time-to-digital converter (TDC) coupled to the digital loop filter, wherein the TDC is coupled to the first power supply rail.

Example 11

The apparatus of example 10 comprises a voltage regulator coupled to the first power supply rail, wherein the voltage regulator is to provide the first power to the first power supply rail.

Example 12

The apparatus of example 11, wherein the voltage regulator comprises a low dropout circuitry.

Example 13

The apparatus of example 10, wherein the oscillator comprises a digitally controlled oscillator.

Example 14

The apparatus of example 10, wherein the oscillator comprises an LC oscillator.

Example 15

A system comprising: a memory; a processor coupled to a memory, the processor including: a first power supply rail to provide a first power; a second power supply rail to provide a second power; a third power supply rail to provide a third power; a voltage divider coupled to the first, second, and third power supply rails; a bias generator coupled to voltage divider and the third power supply rail; an oscillator coupled to the bias generator and the first supply rail; and a clock distribution network to provide an output of the oscillator to one or more logics, wherein the clock distribution network is coupled to the second power supply rail; and a wireless interface to allow the processor to communicate with another device.

Example 16

The system of example 15, wherein the voltage divider includes one or more programmable resistive devices.

Example 17

The system of example 15, wherein the voltage divider is to sense noise on the second power supply rail and is to inject the sensed noise on the bias generator such that an output of the bias generator modulates a frequency of the oscillator according to the injected sensed noise.

Example 18

A system comprising: a memory; a processor coupled to a memory, the processor including: a first power supply rail to provide a first power; a second power supply rail to provide a second power; a third power supply rail to provide a third power; a voltage divider coupled to the first, second, and third power supply rails; a digital loop filter coupled to the voltage divider and the third power supply rail; an oscillator coupled to the digital loop filter and the third power supply rail; a clock distribution network to provide an output of the oscillator to one or more logics, wherein the clock distribution network is coupled to the second power supply rail; and a time-to-digital converter (TDC) coupled to the digital loop filter, wherein the TDC is coupled to the first power supply rail; and a wireless interface to allow the processor to communicate with another device.

The system of example 18 comprises a voltage regulator coupled to the first power supply rail, wherein the voltage regulator is to provide the first power to the first power supply rail.

The system of example 18, wherein the oscillator comprises one of: a digitally controlled oscillator; or an LC oscillator.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:
1. An apparatus comprising:
a first power supply rail to provide a first power;
a second power supply rail to provide a second power;

a third power supply rail to provide a third power, wherein the first power supply rail, the second power supply rail, and the third power supply rail are non-ground power supply rails;
a voltage divider coupled to the first, second, and third power supply rails;
a bias generator coupled to the voltage divider and the third power supply rail;
an oscillator coupled to the bias generator and the first power supply rail; and
a clock distribution network to provide an output of the oscillator to one or more logics, wherein the clock distribution network is coupled to the second power supply rail.

2. The apparatus of claim 1, wherein the bias generator comprises an amplifier which is coupled to the first power supply rail.

3. The apparatus of claim 1, comprising a voltage regulator coupled to the first power supply rail, wherein the voltage regulator is to provide the first power to the first power supply rail.

4. The apparatus of claim 3, wherein the voltage regulator comprises a low dropout circuitry.

5. The apparatus of claim 1, wherein the oscillator is a voltage controlled oscillator.

6. The apparatus of claim 1, wherein the oscillator comprises an LC oscillator.

7. The apparatus of claim 1, comprising a phase frequency detector coupled to the first power supply rail, wherein the phase frequency detector is to receive a reference clock and a feedback clock as inputs, and is to generate one or more outputs indicating a phase difference between the reference clock and the feedback clock.

8. The apparatus of claim 6, comprising a divider coupled to the oscillator and phase frequency detector, wherein the divider is to divide an output of the oscillator and provide the feedback clock, and wherein the divider is coupled by the first power supply rail.

9. The apparatus of claim 1, wherein the voltage divider includes one or more programmable resistive devices.

10. The apparatus of claim 6, wherein the voltage divider is to sense noise on the second power supply rail and is to inject the sensed noise on the bias generator such that an output of the bias generator modulates a frequency of the oscillator according to the injected sensed noise.

11. An apparatus comprising:
a first power supply rail to provide a first power;
a second power supply rail to provide a second power;
a third power supply rail to provide a third power, wherein the first power, the second power, and the third power are positive powers;
a voltage divider coupled to the first, second, and third power supply rails;
a digital loop filter coupled to the voltage divider and the third power supply rail;
an oscillator coupled to the digital loop filter and the third power supply rail;
a clock distribution network to provide an output of the oscillator to one or more logics, wherein the clock distribution network is coupled to the second power supply rail; and
a time-to-digital converter (TDC) coupled to the digital loop filter, wherein the TDC is coupled to the first power supply rail.

12. The apparatus of claim 11, comprising a voltage regulator coupled to the first power supply rail, wherein the voltage regulator is to provide the first power to the first power supply rail.

13. The apparatus of claim 12, wherein the voltage regulator comprises a low dropout circuitry.

14. The apparatus of claim 11, wherein the oscillator comprises a digitally controlled oscillator.

15. The apparatus of claim 11, wherein the voltage divider is to sense noise on the second power supply rail and is to inject the sensed noise on the digital loop filter or the oscillator such that a frequency of the oscillator is modulated by the sensed noise.

16. A system comprising:
a memory;
a processor coupled to a memory, the processor including:
a first power supply rail to provide a first power;
a second power supply rail to provide a second power;
a third power supply rail to provide a third power, wherein the first power supply rail, the second power supply rail, and the third power supply rail are non-ground power supply rails;
a voltage divider coupled to the first, second, and third power supply rails;
a bias generator coupled to voltage divider and the third power supply rail;
an oscillator coupled to the bias generator and the first power supply rail; and
a clock distribution network to provide an output of the oscillator to one or more logics, wherein the clock distribution network is coupled to the second power supply rail; and
a wireless interface to allow the processor to communicate with another device.

17. The system of claim 16, wherein the voltage divider includes one or more programmable resistive devices.

18. The system of claim 16, wherein the voltage divider is to sense noise on the second power supply rail and is to inject the sensed noise on the bias generator such that an output of the bias generator modulates a frequency of the oscillator according to the injected sensed noise.

19. The system of claim 16, wherein the oscillator comprises one of:
a voltage controlled oscillator; or
an LC oscillator.

20. A system comprising:
a memory;
a processor coupled to the memory, the processor including:
a first power supply rail to provide a first power;
a second power supply rail to provide a second power;
a third power supply rail to provide a third power, wherein the first power supply rail, the second power supply rail, and the third power supply rail are non-ground power supply rails;
a voltage divider coupled to the first, second, and third power supply rails;
a digital loop filter coupled to the voltage divider and the third power supply rail;
an oscillator coupled to the digital loop filter and the third power supply rail;
a clock distribution network to provide an output of the oscillator to one or more logics, wherein the clock distribution network is coupled to the second power supply rail; and a time-to-digital converter (TDC) coupled to the digital loop filter, wherein the TDC is coupled to the first power supply rail; and a wireless interface to allow the processor to communicate with another device.

21. The system of claim 20, comprising a voltage regulator coupled to the first power supply rail, wherein the voltage regulator is to provide the first power to the first power supply rail.

22. The system of claim 20, wherein the voltage divider is to sense noise on the second power supply rail and is to inject the sensed noise on the digital loop filter or the oscillator such that a frequency of the oscillator is modulated by the sensed noise.

* * * * *